United States Patent
Singh et al.

(10) Patent No.: US 12,456,577 B2
(45) Date of Patent: Oct. 28, 2025

(54) CAPACITOR WITH ARRAY OF INTERCONNECTS FOR IMPROVED SELF-RESONANT FREQUENCY AND QUALITY FACTOR

(71) Applicant: Dell Products L.P., Round Rock, TX (US)

(72) Inventors: Tejinder Singh, Kanata (CA); Morris Repeta, Ottawa (CA)

(73) Assignee: Dell Products L.P., Round Rock, TX (US)

( * ) Notice: Subject to any disclaimer, the term of this patent is extended or adjusted under 35 U.S.C. 154(b) by 435 days.

(21) Appl. No.: 17/934,701

(22) Filed: Sep. 23, 2022

(65) Prior Publication Data
US 2024/0105387 A1   Mar. 28, 2024

(51) Int. Cl.
*H01G 4/005* (2006.01)
*H01G 4/12* (2006.01)
*H10D 1/68* (2025.01)

(52) U.S. Cl.
CPC ......... *H01G 4/005* (2013.01); *H01G 4/1272* (2013.01); *H10D 1/692* (2025.01)

(58) Field of Classification Search
CPC ....... H01G 4/1272; H01G 4/008; H01L 28/60
See application file for complete search history.

(56) References Cited

U.S. PATENT DOCUMENTS

| 6,066,537 | A  | * | 5/2000 | Poh    | H01L 23/5223 438/251 |
| 6,410,954 | B1 | * | 6/2002 | Sowlati | H01L 27/0805 257/E21.018 |
| 10,998,873 | B2 | * | 5/2021 | Luo    | H01G 2/10 |

(Continued)

FOREIGN PATENT DOCUMENTS

JP    2008177888 A  *  7/2008

OTHER PUBLICATIONS

Irwin, et al., "Basic Engineering Circuit Analysis", New York: John Wiley & Sons, Inc., 2002, 865 pages.

(Continued)

*Primary Examiner* — David M Sinclair
(74) *Attorney, Agent, or Firm* — Amin, Turocy & Watson, LLP

(57) ABSTRACT

The technology described herein is directed towards a capacitor with a modified design (relative to standard capacitors), in which a first conductor is coupled to a second conductor via a distributed array of conducting interconnects through a dielectric that separates the conductors. The array of interconnects can be geometrically distributed. The array of conducting interconnects, not present in standard capacitors, results in capacitors with larger self-resonant frequency, e.g., having a substantially stable capacitance over a range of high radio frequencies, e.g., from one gigahertz to twenty gigahertz. This further provides an improved quality factor. The improvements resulting from the array of interconnects, facilitates more optimal surface current density. The modified capacitor provides benefits in various circuits, e.g., in a tuning element as part of an impedance matching network, in a millimeter wave frequency phase shifter for antenna elements, and so on.

20 Claims, 9 Drawing Sheets

(56) References Cited

U.S. PATENT DOCUMENTS

2007/0278551 A1\* 12/2007 Anthony ............ H01L 23/5223
                                                          257/307
2023/0187144 A1\*  6/2023 Wen ........................ H01G 4/38
                                                          361/301.1

OTHER PUBLICATIONS

Robbins, et al., "Circuit Analysis: Theory and Practice", 5th ed., Cengage Learning, 2012, 1116 pages.
Hughes, et al., "Hughes Electrical and Electronic Technology," 11th ed., Pearson, 2012, 1025 pages.
Glisson, "Introduction to Circuit Analysis and Design," Springer, 2011, 776 pages.
Singh, et al., "Monolithically Integrated Reconfigurable RF MEMS Based Impedance Tuner on SOI Substrate," in 2019 IEEE MTT-S International Microwave Symposium (IMS), doi:10.1109/mwsym.2019.8701106. 3 pages.
Singh, et al., "Thermally Actuated SOI RF MEMSBased Fully Integrated Passive Reflection-Type Analog Phase Shifter for mmWave Applications," IEEE Transactions on Microwave Theory and Techniques, (2020)1-1. doi:10.1109/tmtt.2020.3018141. 13 pages.

\* cited by examiner

CAPACITOR WITH ARRAY OF INTERCONNECTS FOR IMPROVED SELF-RESONANT FREQUENCY AND QUALITY FACTOR

BACKGROUND

Capacitors are fundamental circuit elements in many electronics and electrical applications. With the continuous expansion of high-frequency wireless communications, including fifth generation (5G), sixth generation (6G) and beyond, the performance of capacitors is a significant design consideration.

One design consideration is the self-resonant frequency of a capacitor, which limits its operational frequency, generally because the capacitor's capacitance value increases exponentially while approaching its first self-resonant frequency, (and behaves like an inductive element above the capacitor's self-resonant frequency). Another design consideration is the quality factor (Q-factor) of a capacitor, which in general represents the efficiency of the capacitor in terms of energy loss, that is, the Q-factor of a capacitor is a measure of how lossless the capacitor is. The Q-factor is inversely proportional to the frequency and thus gets worse at higher frequencies, which, like the self-resonant frequency, limits a capacitor's operational frequency.

BRIEF DESCRIPTION OF THE DRAWINGS

The technology described herein is illustrated by way of example and not limited in the accompanying figures in which like reference numerals indicate similar elements and in which.

DETAILED DESCRIPTION

Figure 1:
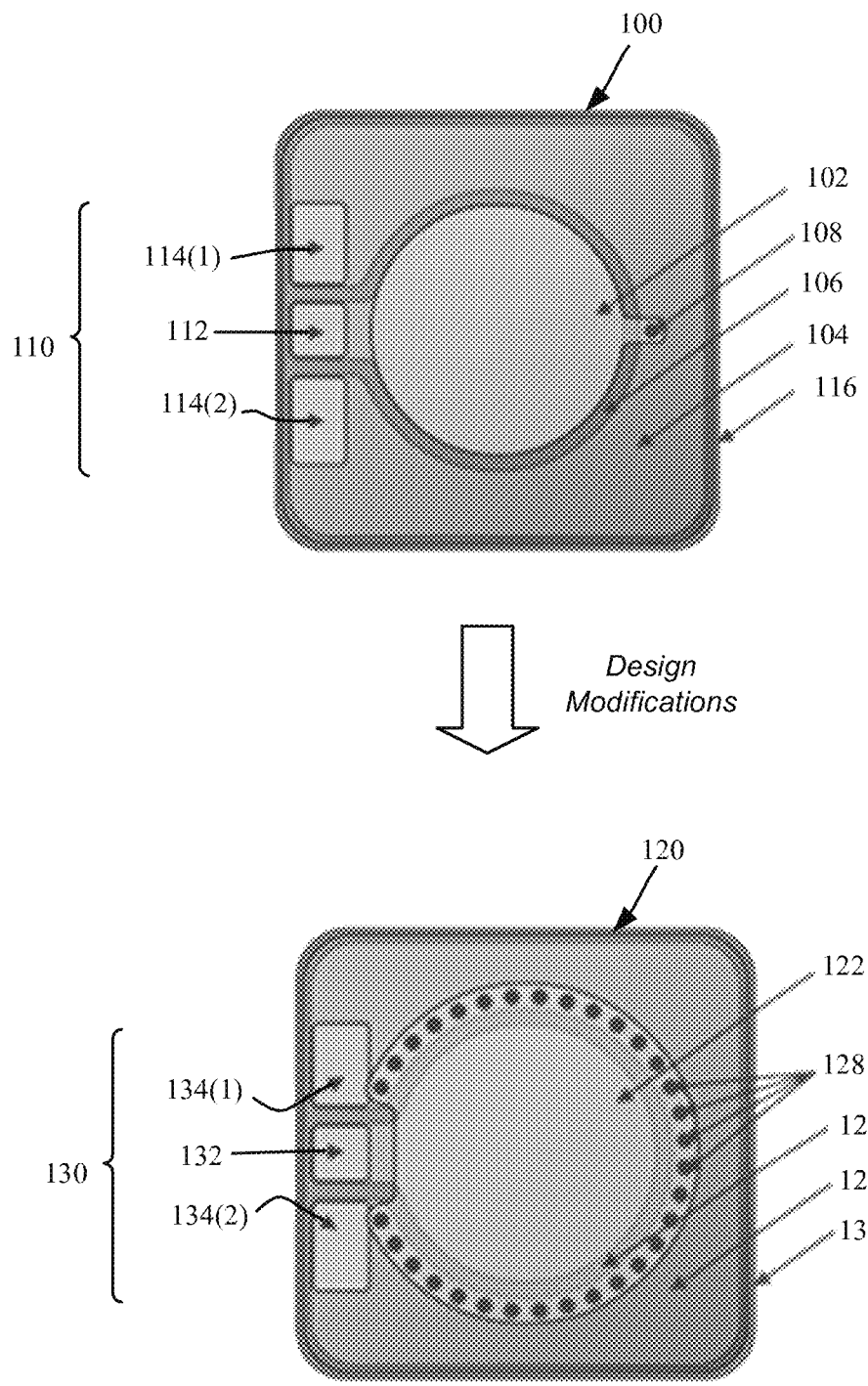
FIG. 1 comprises top view representations of example capacitors, including a modified capacitor having a distributed array of conducting interconnects along the device periphery (in contrast to a conventional capacitor), in accordance with various aspects and implementations of the subject disclosure.

Various aspects of the technology described herein are generally directed towards ultra-high-frequency metal-insulator-metal (MIM) capacitors that improve the self-resonant frequency and Q-Factor while keeping the capacitance value constant. In general, a MIM capacitor is a preferred choice to get a high value of capacitance with a relatively tiny circuit footprint. MIM capacitors can be fabricated on printed circuit boards or on-chip using two metal layers.

As will be seen, the technology described herein is based on a straightforward design change rather than proposing a new/complicated method of manufacturing of on-chip MIM capacitors, which is highly useful in developing 5G, mmWave, and 6G radios and 5G enabled consumer devices such as notebooks and IoTs.

It should be understood that any of the examples herein are non-limiting. Thus, any of the embodiments, aspects, concepts, structures, functionalities or examples described herein are non-limiting, and the technology may be used in various ways that provide benefits and advantages in communications and computing in general. It also should be noted that terms used herein, such as "optimize" or "optimal" and the like only represent objectives to move towards a more optimal state, rather than necessarily obtaining ideal results.

Reference throughout this specification to "one embodiment," "an embodiment," "one implementation," "an implementation," etc. means that a particular feature, structure, or characteristic described in connection with the embodiment/implementation can be included in at least one embodiment/implementation. Thus, the appearances of such a phrase "in one embodiment," "in an implementation," etc. in various places throughout this specification are not necessarily all referring to the same embodiment/implementation. Furthermore, the particular features, structures, or characteristics may be combined in any suitable manner in one or more embodiments/implementations.

Aspects of the subject disclosure will now be described more fully hereinafter with reference to the accompanying drawings in which example components, graphs and/or operations are shown. In the following description, for purposes of explanation, numerous specific details are set forth in order to provide a thorough understanding of the various embodiments. However, the subject disclosure may be embodied in many different forms and should not be construed as limited to the examples set forth herein.

The following detailed description is merely illustrative and is not intended to limit embodiments and/or application or uses of embodiments. Furthermore, there is no intention to be bound by any expressed or implied information presented in the preceding sections, or in the Detailed Description section.

One or more embodiments are now described with reference to the drawings, wherein like referenced numerals are used to refer to like elements throughout. In the following description, for purposes of explanation, numerous specific details are set forth in order to provide a more thorough understanding of the one or more embodiments. It is evident, however, in various cases, that the one or more embodiments can be practiced without these specific details.

Further, it is to be understood that the present disclosure will be described in terms of a given illustrative architecture; however, other architectures, structures, substrate materials and process features, and steps can be varied within the scope of the present disclosure.

It will also be understood that when an element such as a layer, region or substrate is referred to as being "on" or "over" another element, it can be directly on the other element or intervening elements can also be present. In contrast, only if and when an element is referred to as being "directly on" or "directly over" another element, are there are no intervening element(s) present. Note that orientation is generally relative; e.g., "on" or "over" can be flipped, and if so, can be considered unchanged, even if technically appearing to be under or below/beneath when represented in a flipped orientation. It will also be understood that when an element is referred to as being "connected" or "coupled" to another element, it can be directly connected or coupled to the other element or intervening elements can be present. In contrast, only if and when an element is referred to as being "directly connected" or "directly coupled" to another element, are there no intervening element(s) present.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment," as well any other variations, appearing in various places throughout the specification are not necessarily all referring to the same embodiment. Repetitive description of like elements employed in respective embodiments is omitted for sake of brevity.

In general, capacitors are electronic circuit elements that store an electrical charge. Capacitors are basically conductive metal plates separated by an insulator (dielectric). The capacitance, or amount of charge held by the capacitor per applied voltage, depends on parameters including the area of the plates, the distance between the plates, and the dielectric constant value of the insulator layer between the plates. Capacitors are used in a variety of devices such as filters, analog-to-digital converters, memory devices, control applications, high frequency electronics and many other types of electronic circuits. Radio frequency (RF) circuits have associated capacitive elements, as at high frequencies capacitive and inductive effects become more prominent relative to direct current or low frequencies.

One type of capacitor is a metal-insulator-metal (MIM) capacitor, which is frequently used with circuits needing high capacitance in a small area. MIM capacitors are developed using two layers of a printed circuit board (PCB) or similar material stack, utilizing the dielectric layer between as the dielectric insulator.

In electrical circuits, reactance is the opposition presented to alternating current by inductance or capacitance; reactance is similar to resistance but differs in that reactance does not lead to dissipation of electrical energy as heat, but instead stores energy which is returned to the circuit a quarter cycle later. As frequency increases, inductive reactance increases and capacitive reactance decreases.

With high frequency circuits such as for 5G, millimeter wave (mmWave) or sub-terahertz (sub-THz, between 90 and 300 gigahertz, typically beyond 100 gigahertz) frequencies, the capacitive reactance and its relationship with the increasing frequency are significant considerations. Capacitive reactance, Xc, in ohms ($\Omega$) is given by:

$$Xc = -\frac{1}{\omega C} = -\frac{1}{2\pi f C}$$

where, f is the frequency in hertz (Hz), and C is the capacitance in farads (F). The impedance of a capacitor is given by $C = -jX_c$.

At f=0, the magnitude of the capacitor's reactance is infinite, behaving like an open circuit and thus preventing any current from flowing through the dielectric. As frequency increases, the magnitude of reactance decreases, allowing more current to flow. As f approaches infinity, the capacitor's reactance approaches 0, behaving like a short circuit.

Inductive reactance is a property exhibited by an inductor, in which an electric current produces a magnetic field around an inductor. In the context of an alternative current circuit, the magnetic field is constantly changing because of the oscillating current. The change in the magnetic field that induces another electric current to flow in the same wire, in a direction such as to oppose the flow of current originally responsible for producing the magnetic field. Hence, inductive reactance is an opposition to the change of current through an element.

Inductive reactance $X_L$ is proportional to the sinusoidal signal frequency f and the inductance L, which depends on the physical shape of the inductor and is given by:

$X_L = \omega L = 2\pi f L$

The quality factor, or simply the Q-factor or Q is a parameter that describes the resonance behavior of an underdamped harmonic oscillator or resonator. Sinusoidally driven resonators having higher Q-factors resonate with greater amplitudes at resonant frequency, but have a smaller range of frequencies around that frequency at which they resonate; the range of frequencies for which the oscillator resonates is called the bandwidth. Thus, a high-Q tuned circuit in a radio receiver is more difficult to tune but has more selectivity, whereby it does a better job of filtering out signals from other stations that lie nearby on the spectrum. High-Q oscillators oscillate with a smaller range of frequencies and are more stable.

In real circuits, resistance cannot be avoided. All conductors at room temperature such as aluminum, copper, gold, platinum, tungsten, etc., have finite conductivity except superconductors, which have near zero resistance at cryogenic temperatures (near zero still means minimal resistance but not completely zero). A capacitor or inductive element when implemented in a circuit has small effective resistance R associated within. The Q-factor of a capacitor at the operating frequency f is defined as the ratio of the reactance of the capacitor to its series resistance.

The Q-factor of a capacitor represents the efficiency of a given capacitor in terms of energy losses or in short, the Q of a capacitor is a measure of how lossless a capacitor is and is given by $$Q = \frac{X_C}{R_C} = \frac{1}{2\pi f C R_C}$$

where, f is frequency (Hz), C is capacitance in farads, Xc is reactance of the capacitor in ohms, and $R_C$ is the equivalent series resistance (ESR) of the capacitor in ohms. With increasing frequency, Q-factor decreases (gets worse). For example, in an ideal scenario, a 1 picofarad (pF) capacitor with 0.1 ohms resistance would have a Q of 159 at 10 GHz; however, in practice, the design of capacitor, processing technology, material purity, contamination and so forth can deteriorate the Q-factor significantly.

In an alternating current system, the Q-factor represents the ratio of energy stored in the capacitor to the energy dissipated as thermal losses in the equivalent series resistance. For example, a capacitor that can store 2,000 joules of energy while wasting only 1 joule has a Q-factor of 2,000. Because Q is the measure of efficiency, an ideal capacitor would have an infinite value of Q meaning that no energy is lost at all in the process of storing energy. This is derived from the fact that the equivalent series resistance of an ideal capacitor equals zero.

The Q-factor is not a constant value, but rather changes significantly with frequency. One reason is the clear $2\pi f$ term in the above equation; another is that equivalent series resistance is not a constant value with respect to frequency. The equivalent series resistance varies with frequency due to the well-known skin effect, in which current tends to flow around the outer edge of a conductor, as well as other effects related to the dielectric characteristics.

Lower frequency applications do not have to take the Q-factor into consideration, and standard capacitors may be used in those applications. However, the Q-factor is a significant capacitor characteristic in the design of RF circuits. At RF frequencies, the equivalent series resistance increases with frequency due to the skin effect. Along with the increase in equivalent series resistance, dissipative losses increase as well. Therefore RF circuits typically use high-Q capacitors to reduce high-frequency losses. Q-factor considerations become even more significant when designing circuits for 5G and mmWave applications.

Further, the self-resonance of a capacitor imposes a frequency limit where a capacitor acts as true capacitive reactance to the circuit. After the resonance point, the impedance rotates, and the capacitor starts to act as an inductive element. Note that in practice, a real capacitor is actually a series RLC (resistor-inductor-capacitor) circuit, and the resonance frequency can be estimated if the leakage resistance, equivalent series resistance, and equivalent series inductance (ESL) are known. Capacitors and inductors have multiple self-resonant frequencies over increasing frequency, which depends on the construction, type, value, and integration method. SRF is thus a significant parameter to consider when designing capacitors for 5G/mmWave applications and it becomes increasingly difficult to develop circuits for 6G and Sub-THz applications due to the self-resonant frequency of the elements.

Typically, the self-resonant frequency of a capacitor fits a downward, generally straight line on a log-log scale when the self-resonant frequency is plotted against capacitance value. As a result, for example, to develop 5G FR1 radios operating under 6 GHz, the capacitors need to be designed with SRF way beyond 6 GHz, as capacitor value increases exponentially while approaching its first SRF.

Figure 2:
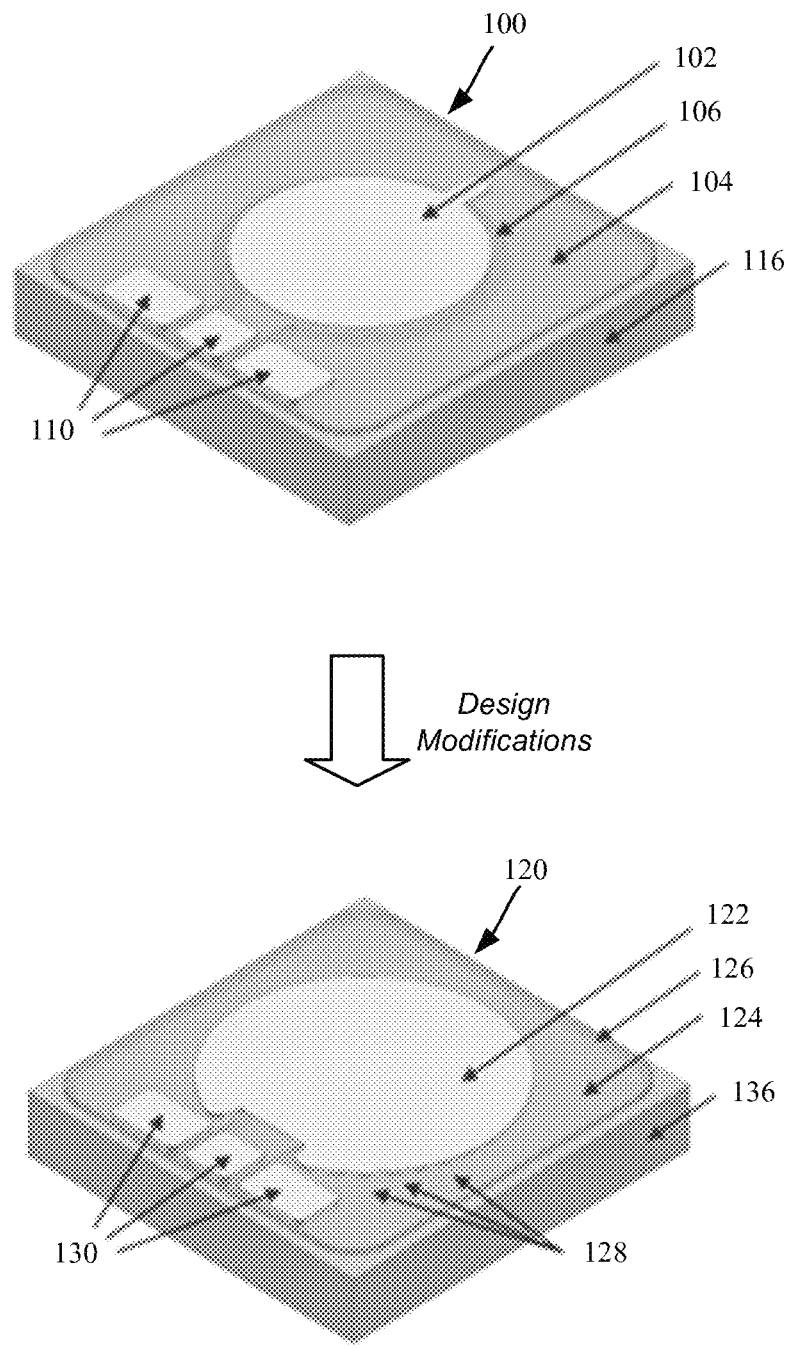
FIG. 2 shows perspective view representations of the example capacitors of FIG. 1, in accordance with various aspects and implementations of the subject disclosure.

As shown in the upper portion of FIG. 1 (top view) and FIG. 2 (perspective view), a conventional metal-insulator-metal capacitor 100 is constructed by two overlapping conductors 102 and 104 with a dielectric 106 (also referred to as an insulator medium) in between. Various parameters dictate the capacitance value including dielectric thickness, dielectric constant or permittivity and the overlapping area of metal conductors.

A single metal interconnect 108 facilitates a small current flow via between the conductors 102 and 104 Note that the RF ports (collectively 110) include an RF signal port 112 and RF ground port(s) 114(1) and 114(2). For purposes of measurement and device integration, a coplanar waveguide (CPW) port design is utilized in which the RF signal port and RF ground ports are both on the same plane. The coplanar waveguide implementation does not rely on material thickness, which is standard in microstrip implementations.

A substrate 116 is underneath the other components. Note that while a capacitor's self-resonant frequency can be improved by using vertically stacked capacitors, (which is not possible in various PCB or microfabrication processes), the self-resonant frequency also can be improved by removing the substrate underneath the device; in general, however, this makes the device unreliable.

Figure 3:
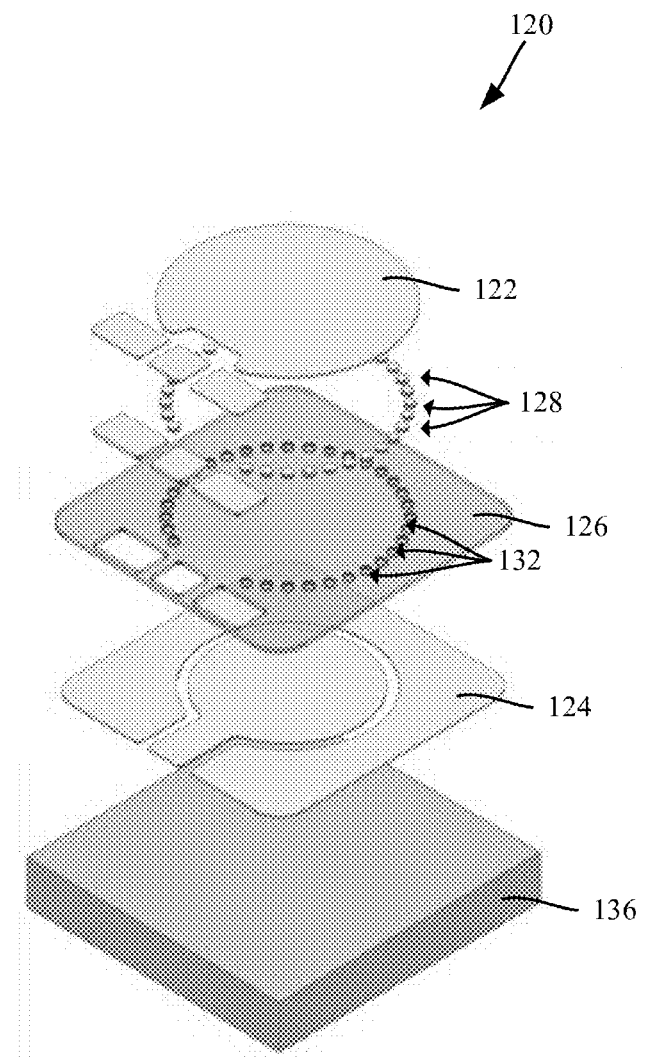
FIG. 3 shows an exploded view of a modified capacitor having a distributed array of conducting interconnects along the device periphery, in accordance with various aspects and implementations of the subject disclosure.

The technology described herein, represented in the lower portion of FIG. 1, is based on design modifications that result in a metal-insulator-metal capacitor 120 that significantly improves the self-resonant frequency and Q-factor (relative to the conventional metal-insulator-metal capacitor 100), including by distributing the interconnects 128 around the desired overlap area periphery of the two overlapping conductors 122 and 124 with a dielectric 126. This is also shown in the lower portion of FIG. 2 (perspective view) and FIG. 3 (exploded view). FIG. 3 also shows the vias 132 through the dielectric medium 126. Note that in general, this capacitor design is independent of dielectric thickness, permittivity, and/or overlapping area.

As can be seen, straightforward design modifications at the circuit design level facilitate the development of miniaturized high-performance monolithic metal-insulator-metal capacitors with high capacitance values, regardless of material stack change or any heterogeneous integration using vendor components. With this design modification during circuit design, the self-resonant frequency can be pushed far beyond the operational band of interest with simultaneous Q-factor improvement, while not being dependent on choice of materials. The technology described herein is thus based on design modification(s), and significantly can be accomplished with no modification required on the fabrication or manufacturing side.

More particularly, one or more implementations of the technology described herein are based on straightforward design modifications, including extending the top conductor electrode 122 to cover a portion of the RF ground plane as shown in FIGS. 1-3. Note that this is in contrast to traditional or standard MIM capacitors, which are designed by overlapping the top conductor electrode only on top of the required capacitive area as generally represented in FIGS. 1 and 2.

As also shown in FIG. 3, another straightforward design modification is the distributing of the vias 132 between the top conductor layer 122 and bottom conductor layer 124 alongside the periphery of the RF ground plane. As set forth herein, this is in contrast to a traditional or standard MIM capacitor as shown that is implemented using only a single interconnect 108 (FIG. 1).

As can be readily appreciated, the design modifications described herein can be used with any arbitrary shape of MIM capacitor, not only a circular overlapping area but other shapes, e.g., rectangular. Further, the technology described herein can be used on standard two-layer MIM capacitors that include two metal conductor electrodes, as well as in multilayer MIM capacitors, which can potentially include multiple metal conductor layers (e.g., a third conductor and a second insulator) to reduce the overall area of the device.

Figure 4A:
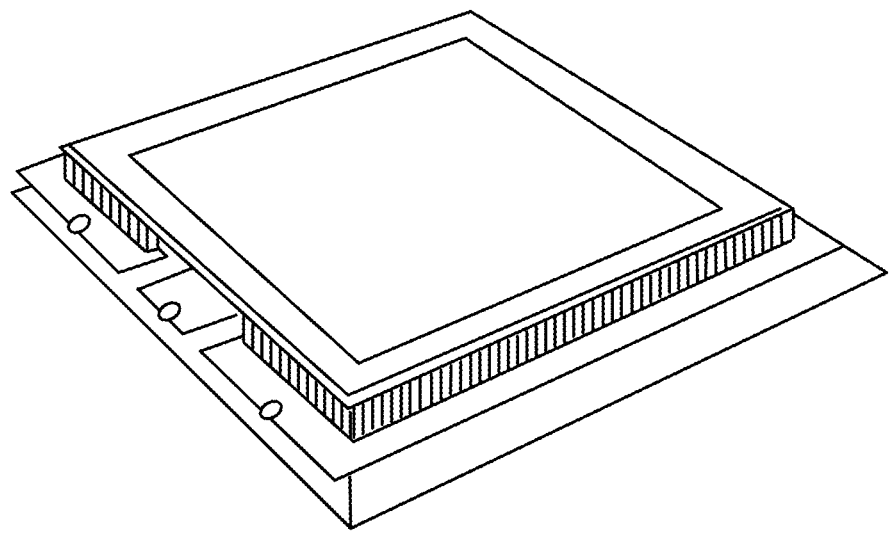
FIG. 4A is a three-dimensional model representation of a modified capacitor having a distributed array of conducting interconnects along the device periphery, in accordance with various aspects and implementations of the subject disclosure.
Figure 4B:
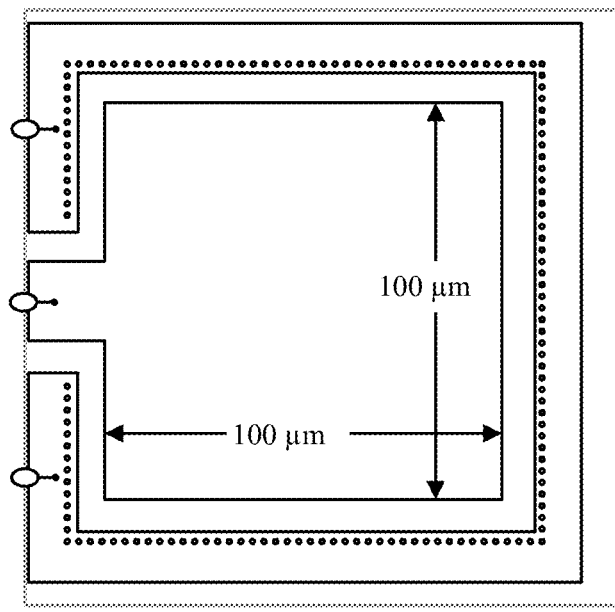
FIG. 4B is a top view model representation of a modified capacitor having a distributed array of conducting interconnects along the device periphery, in accordance with various aspects and implementations of the subject disclosure.

The self-resonant frequency and Q-factor improvements can be seen and made more optimal by investigating the current density. In addition to geometrically distributing the interconnects along the RF ground plane device periphery, the self-resonant frequency and Q-factor can be better optimized by investigating the magnitude of the surface current density (Jxy) given in Amperes/meter (A/m). Current typically travels along the edges of the metal, whereby distributing the interconnect arrays significantly reduces the path for current distribution. Indeed, two different simulation studies were carried out, one using method-of-moment (MoM) technique and the other using finite element method (FEM) technique. MoM and FEM are both completely different partial differential equation solvers. While MoM mainly relies on meshing the device and investigating the closed form equation, the FEM solver also creates an adaptive mesh and solves Maxwell's partial differential equations to compute the electromagnetic fields. Because MoM and FEM simulations are time consuming, the three-dimensional (3D) models can be simplified to reduce overall meshing time. FIG. 4A shows the 3D model of the capacitor with distributed interconnects described herein; FIG. 4B shows a top view.

Figure 5A:
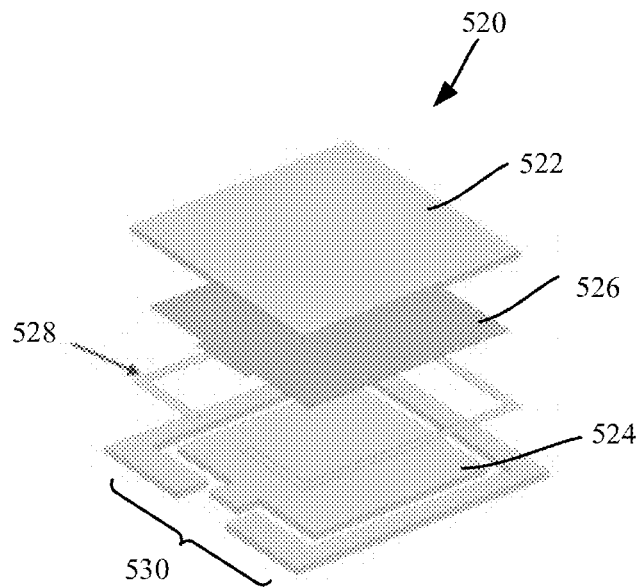
FIG. 5A is an exploded view representation of a simplified, modified capacitor having an array of conducting interconnects along the device periphery that are combined into a ring, in accordance with various aspects and implementations of the subject disclosure.
Figure 5B:
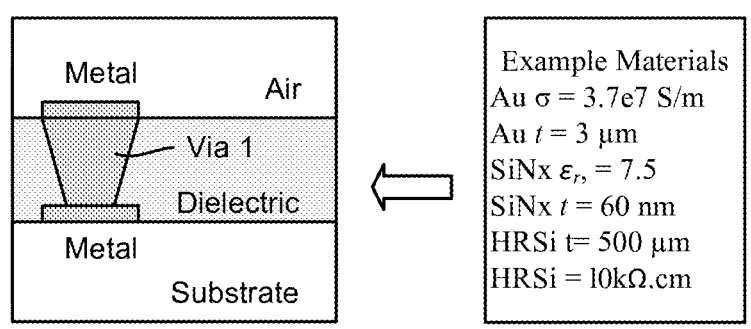
FIG. 5B is a side-view representation of a modified capacitor in conjunction with an example materials stack and parameters used in simulations, in accordance with various aspects and implementations of the subject disclosure.

FIG. 5A is a simplified 3D model 520 of the capacitor shown in FIG. 3, which like components are labeled 5xx instead of 1xx; this model was used in the FEM simulation, described below. Note the generally rectangular shape of the metal conductors and insulator, and that instead of a distributed array of interconnects around the RF ground plane, a simplified, solid conducting interconnect ring (basically the distributed interconnects are coupled to one another) is presented to obtain similar SRF and Q improvement by making more optimal the surface current density. A standard capacitor model (e.g., without the interconnect ring) was evaluated in a like simulation for comparison. As shown in FIG. 4B, the overlapping area of both the standard and proposed capacitors are 100 µm×100 µm, with a 60-nanometer interconnect ring and dielectric. Material parameters include 3 µm gold (Au) for the upper and lower conductors, and silicon nitride (SiNx) for the dielectric. FIG. 5B shows an example of a possible materials stack and parameters used for the MoM simulations.

Figure 6:
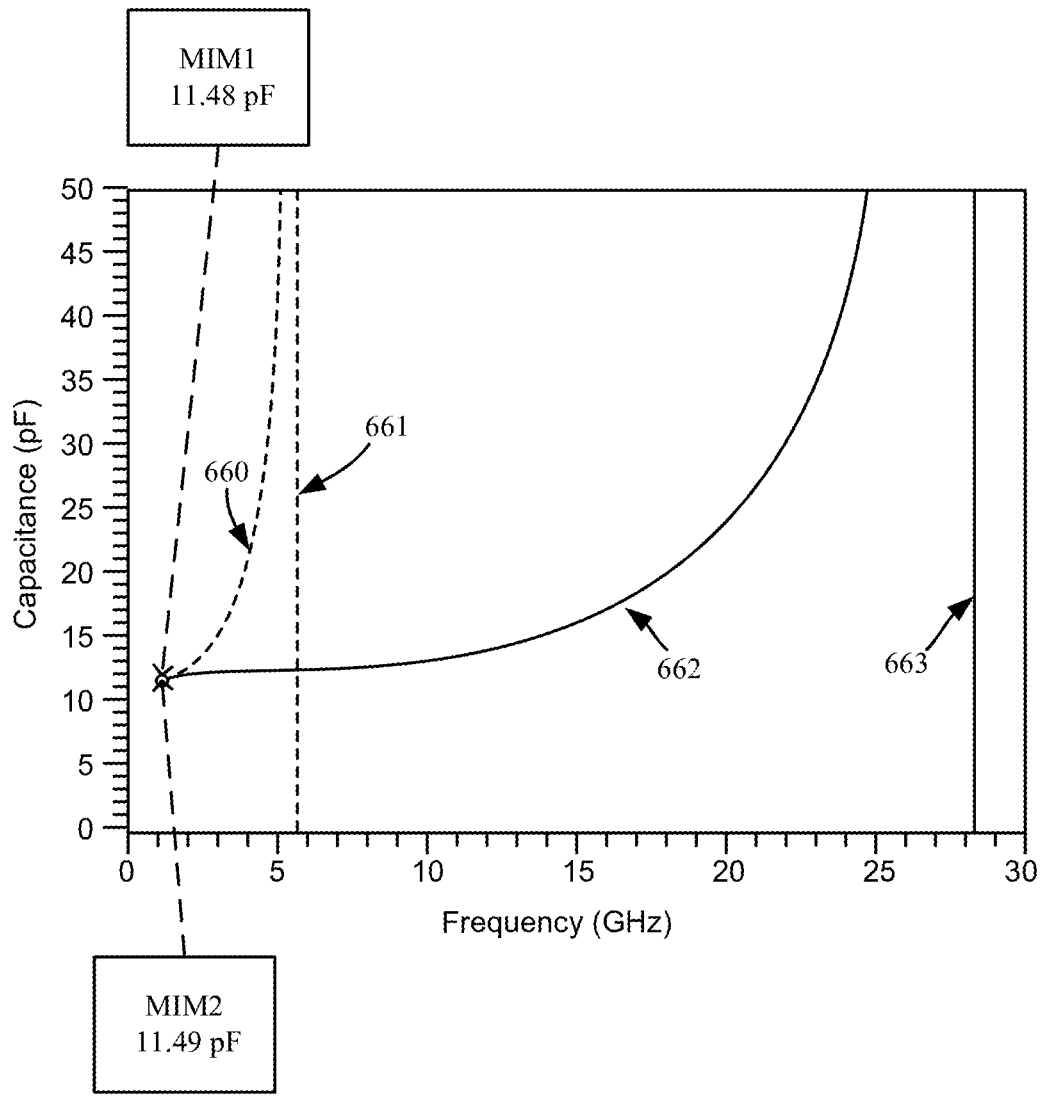
FIG. 6 is a graph of frequency versus capacitance for a modeled standard capacitor and for a modeled modified capacitor, in accordance with various aspects and implementations of the subject disclosure.

The SRF and Q factor values of both the standard device (MIM1) and modified device (MIM2) were simulated using the MoM technique, with the overlapping area of 100 µm×100 µm and material parameters described herein. The capacitance can be theoretically calculated by $$C = \frac{\varepsilon_0 A}{d}$$

where C is the capacitance in farads, $\varepsilon_0$ is the permittivity of free space, $\varepsilon_r$ is the permittivity of the dielectric layer between metal conductors, A is the overlapping area of two conductors, and d is the thickness of dielectric layer or separation between two conductors. The theoretical capacitance value is 11.06 pF which is close to the simulated value of 11.48 pF for the standard device MIM1, and 11.49 pF for the modified capacitor device MIM2 as shown in FIG. 6. The plot demonstrates capacitance change with increase in frequency, with the dashed curved line (labeled 660) representing the capacitance of the standard device MIM1, and the solid curved line (labeled 662) representing the capacitance of the modified device MIM2 over increasing frequency.

As shown in FIG. 6, for low frequency applications, the capacitance value does not change, but as the frequency increases, the capacitance of the standard MIM1 capacitor starts increasing exponentially, thus making it unusable for 5G radio circuits. The self-resonant frequency of the MIM1 capacitor, 5.8 GHz, is generally represented by the vertical dashed line (labeled 661). Indeed, the similariton shows that the standard MIM1 capacitor is not usable beyond 3 GHz; a frequency higher than the self-resonant frequency results in the MIM1 capacitor showing inductive behavior.

In contrast, the modified MIM2 capacitor represented by the solid curved line (labeled 662) shows a substantially more stable capacitance range over 1 GHz to 20 GHz before slowly increasing. Indeed, the self-resonant frequency of the MIM2 capacitor has been increased by more than four-and-a half times relative to the standard design; the self-resonant frequency of the MIM2 capacitor is depicted by the solid vertical line (labeled 663) at 28.2 GHz.

This highlights the improved circuit design of the technology described herein, by which RF components and circuits are not limited to sub-6 GHz, but can be used with circuits and components at mmWave frequencies. It should be noted that 11.5 pF is considered a high capacitance range and no commercially available high value, high SRF capacitors is known.

Figure 7:
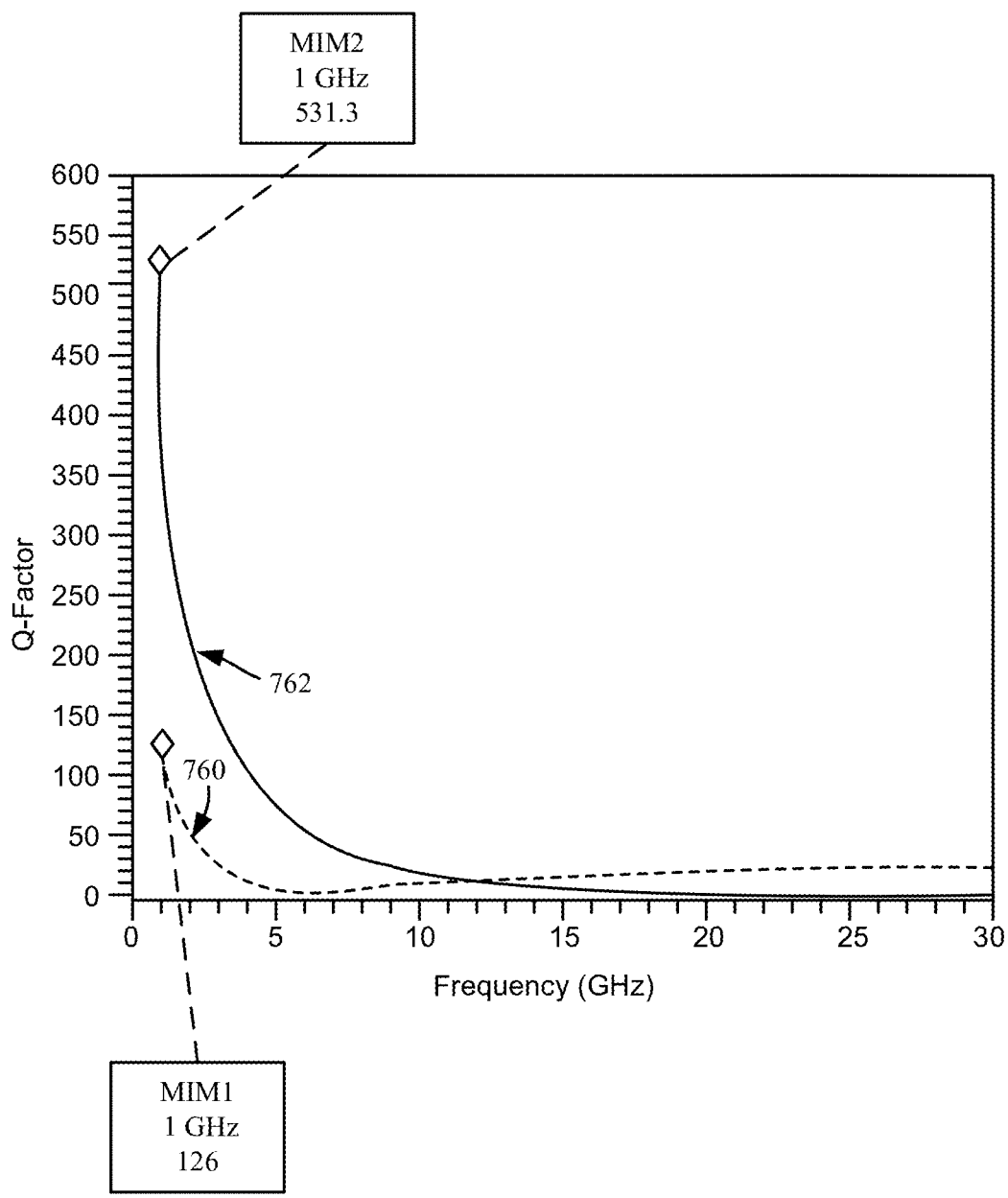
FIG. 7 is a graph of frequency versus quality factor for a modeled standard capacitor and for a modeled modified capacitor, in accordance with various aspects and implementations of the subject disclosure.

Further, as shown in FIG. 7, for the MIM1 device, the Q-factor (the dashed line labeled 760) is 126 at 1 GHz, which has been improved to 531.3 for the MIM2 device (the solid line labeled 762). This is more than 4.2 times. Most known commercial MIM capacitors exhibit a Q-factor of less than 200 at 1 GHz. The capacitance and/or Q-factor likely can be further improved by utilizing a high dielectric constant material such as hafnium dioxide with permittivity of more than 35-40; (the simulations assumed a reasonable dielectric constant of 7.5 of silicon nitride which is readily available for use in printed circuit board stacks.

Figure 8:
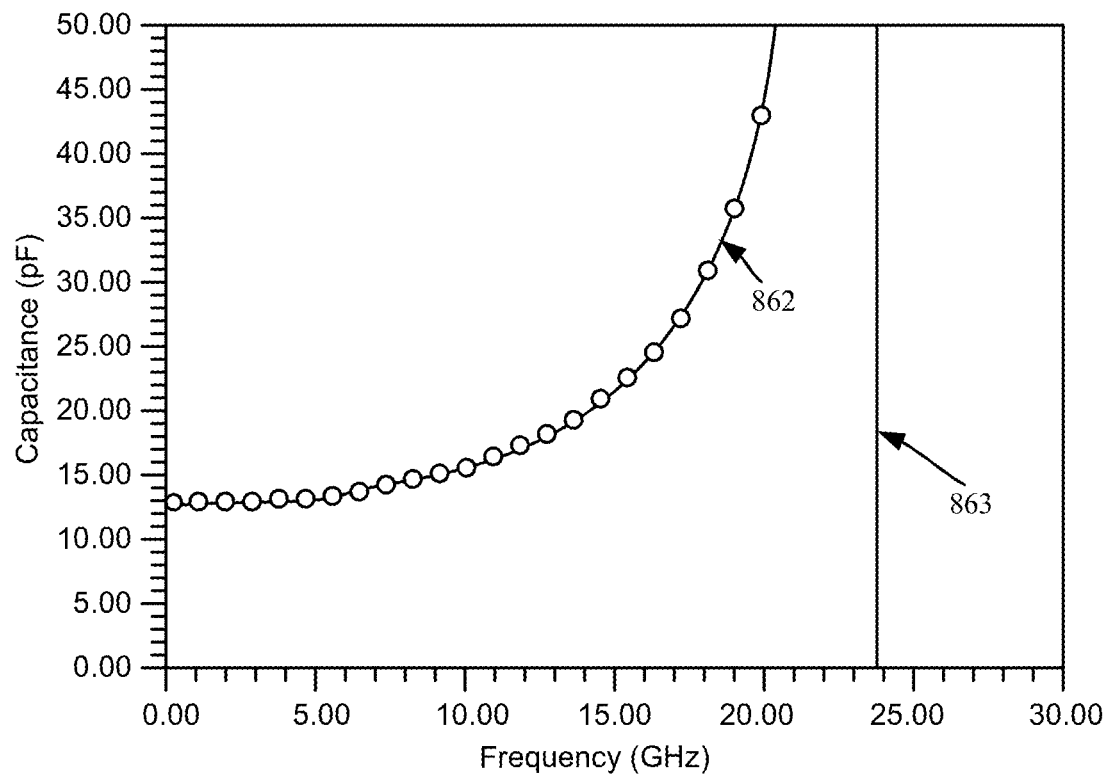
FIG. 8 is a graph of frequency versus capacitance of a modeled modified capacitor with a simplified interconnect ring, in accordance with various aspects and implementations of the subject disclosure.

The MoM simulations were verified using a completely different technique known as FEM, which takes significantly longer time than the MoM technique. FEM solves partial differential equations and computes electromagnetic fields. As set for above with reference to FIG. 5A, for these simulations the device was further simplified by replacing the distributed interconnect array with a metal ring, which has the same effect as interconnect vias. Similar material properties were used The FEM technique shows the same capacitance value as the overlapping area, metal conductivity, and material thickness remains same in both simulation techniques. The capacitance change with increase in frequency is shown in FIG. 8. The SRF of the MIM2 capacitor is at 23.8 GHz; the SRF simulated using FEM technique is a bit lower than that of MoM technique because of the simplified solid metal ring instead of distributed interconnect array. The response is still approximately 4.1× better than the standard MIM1 capacitor.

Figure 9:
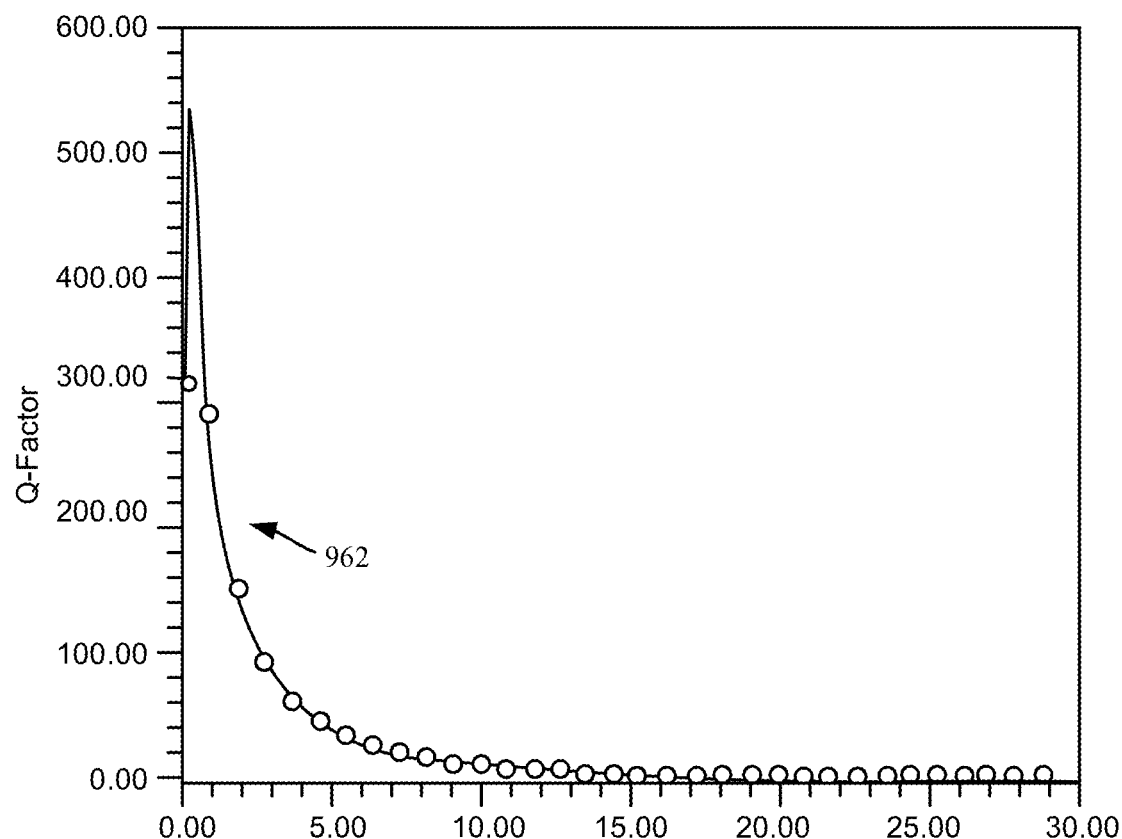
FIG. 9 is a graph of frequency versus quality factor of a modeled modified capacitor with a simplified interconnect ring, in accordance with various aspects and implementations of the subject disclosure.

The Q-factor response simulated using FEM technique is shown in FIG. 9, highlighting a Q of more than 530 for the MIM2 capacitor. Using the FEM technique, Q-factor of MIM2 is approximately 4.3× higher than MIM1. Similarly, the current distribution can be verified, and the surface current density graphed. The maximum current distribution is along the RF port only, which effectively reduces the current distribution path and leads to improvement of the SRF and the Q-factor simultaneously.

Some non-limiting usage examples of the capacitors based on the technology described herein include impedance matching networks (IMN), or simply impedance tuners, which are needed on user equipment devices (UEs) and base stations. Impedance matching networks utilizing various different technologies are integrated in a wide range of commercial wireless communication devices. Impedance matching networks compensate for the antenna impedance variations that arise within a radio frequency front end due to switching of frequency bands of operation, e.g., when a UE moves between different cellular frequency bands, switching from 4G LTE to 5G network, switching between cellular and Wi-Fi nodes, and the like. Impedance matching networks can also adapt dynamically with variations in output RF power levels, temperature, orientation of the UE, and process deviations as these networks ensure highest system efficiency and optimum power transfer.

Typically, impedance matching networks are developed by having switches integrated with a wide variety of fixed MIM capacitors, or by having some sort of variable capacitance. A large value of stable MIM capacitors, including with high SRF and high Q-factor as described herein, provide a large tuning range such that a single impedance matching network can perform better than integrating multiple impedance matching networks for different tuning range.

Thus, impedance matching networks are needed in a wide range of RF equipment; a fundamental element of impedance matching networks are capacitors. High performance MIM capacitors as described herein facilitate developing impedance matching networks that can not only be used in 5G or mmWave radio equipment, but also in a large variety of consumer electronics such as notebooks, tablets, and other UE devices.

Another usage example for high SRF and high Q-factor capacitors as described herein is in reflective type phase shifters for beamforming. Phase shifters play an important role in the modem phased array systems' performance to provide a wide RF phase tuning range with low transmission loss. Phased arrays are used for beamforming, which is significant in 5G and mmWave communications, because it provides for directional transmission or reception of signals.

While antennas are fixed elements on a printed circuit board or other substrate, their radiation pattern can be tuned by providing an electronic phase shift by including a phase shifter just before the antenna elements. There are various methods to provide phase shift, but effective ones include reflective type phase shifters (RTPS). For monolithically integrated phased array systems for beamforming, reflective type phase shifters provide high phase shift resolution due to their small size and circuit topology. The most common designs of reflective type phase shifters utilize a hybrid couple with two LC (inductor-capacitor) reflection loads. Hybrid couplers are fixed for a certain frequency band, but the range of phase tuning depends on how much capacitance tuning can be achieved from a reflective load. With a range of capacitance, a small phase shift is achieved, but the range can only be extended by adding a large number of LC sections; however, the phase shift range saturates. A more optimal way to increase the phase shift range is to have higher value capacitors with large SRF as described herein, because a large value of capacitance range reduces the number of sections, which keeps the circuit size small, and allows faster tuning, because a larger number of elements require a large number of switching elements. A single element also provides better reliability.

Capacitors with SRF below the frequency band of interest should not be used, because the capacitive reactance would behave like an inductance reactance, forfeiting the whole circuit design and can potentially damaging the antenna elements. MIM capacitors with high capacitance values having SRF beyond operational frequency band allow developing phase shifters having a large tuning range in a small area. Such phase shifters can be used in 5G infrastructure including but not limited to UE, radio units, 5G intelligent beamforming, mmWave consumer devices such as laptops.

One or more aspects can be embodied in a capacitor device, such as described and represented in FIGS. 1-5B herein. The capacitor device can include a first conductor, a second conductor, and a dielectric layer between the first conductor and the second conductor, the dielectric layer coupled to a distributed array of respective conducting interconnects as respective vias to facilitate electrical surface current flow between the first conductor and the second conductor.

The respective conducting interconnects can be distributed along a periphery of a radio frequency ground plane of the capacitor device.

The respective conducting interconnects can be distributed in a circular or substantially circular pattern.

The capacitor device can have a substantially stable capacitance when operating using frequencies ranging from one gigahertz to twenty gigahertz.

The capacitor device has a quality factor of at least five hundred when operating with a frequency of one gigahertz.

At least one conducting interconnect of the respective conducting interconnects can be proximate to a radio frequency port of the capacitor device.

At least two conducting interconnects of the respective conducting interconnects can be proximate to radio frequency ports of the capacitor device.

One or more aspects can be embodied in a capacitor device, such as represented herein. The device can include a first conductor electrode separated from a second conductor electrode by a dielectric medium to operate as a metal-insulator-metal capacitor with a radio frequency ground plane. The capacitor device can further include an array of interconnects aligned with a periphery of the radio frequency ground plane, wherein the array of interconnects enables electrical vias from the first conductor electrode to the second conductor electrode through the dielectric medium to reduce a surface current density of the metal-insulator-metal capacitor.

The first conductor electrode can extend to cover the radio frequency ground plane.

The array of interconnects can be geometrically distributed.

The array of interconnects can be geometrically distributed in a circular pattern or substantially circular pattern.

The array of interconnects can be geometrically distributed in a rectangular pattern or substantially rectangular pattern.

The dielectric medium can be a first dielectric medium, and the device can further include a third conductor electrode separated from the second conductor electrode by a second dielectric medium.

The metal-insulator-metal capacitor can operate with at least one of: substantially stable capacitance with frequencies ranging from about one gigahertz to about twenty gigahertz, or a quality factor of greater than five hundred during operation at a frequency of about one gigahertz.

One or more aspects can be embodied in a capacitor device, such as described and represented herein. The capacitor device can include a first conductor overlapping with a dielectric layer; the dielectric layer can overlap with a second conductor. The first conductor can be electrically coupled to the second conductor via an array of interconnects through the dielectric layer, and the second conductor can be coupled to a substrate.

The first conductor can extend over at least a portion of a radio frequency ground plane associated with the capacitor.

The array of interconnects can comprise a geometrically distributed array.

The array of interconnects can be positioned proximate to a periphery of the first conductor.

The capacitor can be used in a tuning element as part of an impedance matching network.

The capacitor can be a part of a millimeter wave frequency phase shifter for antenna elements.

As can be seen, there is provided a capacitor technology for capacitors with high self-resonant frequency and Q-factor for use in high frequency (e.g., RF) applications. Advantages compared to other known solutions include more stable capacitance at higher (e.g., mmWave) frequencies. Further, the technology can be implemented with straightforward design modifications.

What has been described above include mere examples. It is, of course, not possible to describe every conceivable combination of components, materials or the like for purposes of describing this disclosure, but one of ordinary skill in the art can recognize that many further combinations and permutations of this disclosure are possible. Furthermore, to the extent that the terms "includes," "has," "possesses," and the like are used in the detailed description, claims, appendices and drawings such terms are intended to be inclusive in a manner similar to the term "comprising" as "comprising" is interpreted when employed as a transitional word in a claim.

The descriptions of the various embodiments have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A capacitor device, comprising:
   a first conductor;
   a second conductor; and
   a dielectric layer between the first conductor and the second conductor, the dielectric layer coupled to a distributed array of respective conducting interconnects as respective vias that cause electrical surface current flow between the first conductor and the second conductor, wherein the respective vias are distributed to increase high-frequency performance of the capacitor device by reducing a surface current density of the capacitor device.

2. The capacitor device of claim 1, wherein the respective conducting interconnects are distributed along a periphery of a radio frequency ground plane of the capacitor device.

3. The capacitor device of claim 1, wherein the respective conducting interconnects are distributed in a circular or substantially circular pattern.

4. The capacitor device of claim 1, wherein the capacitor device has a substantially stable capacitance when operating using frequencies ranging from one gigahertz to twenty gigahertz.

5. The capacitor device of claim 1, wherein the capacitor device has a quality factor of at least five hundred when operating with a frequency of one gigahertz.

6. The capacitor device of claim 1, wherein at least one conducting interconnect of the respective conducting interconnects is proximate to a radio frequency port of the capacitor device.

7. The capacitor device of claim 1, wherein at least two conducting interconnects of the respective conducting interconnects are proximate to radio frequency ports of the capacitor device.

8. A device, comprising:
   a first conductor electrode separated from a second conductor electrode by a dielectric medium to operate as a metal-insulator-metal capacitor with a radio frequency ground plane; and
   an array of interconnects aligned with a periphery of the radio frequency ground plane, wherein the array of interconnects enables electrical vias from the first conductor electrode to the second conductor electrode through the dielectric medium, wherein the electrical vias cause an increase in high-frequency performance of the metal-insulator-metal capacitor by facilitating a reduction in a surface current density of the metal-insulator-metal capacitor.

9. The device of claim 8, wherein the first conductor electrode extends to cover the radio frequency ground plane.

10. The device of claim 8, wherein the array of interconnects is geometrically distributed.

11. The device of claim 8, wherein the array of interconnects is geometrically distributed in a circular pattern or substantially circular pattern.

12. The device of claim 8, wherein the array of interconnects is geometrically distributed in a rectangular pattern or substantially rectangular pattern.

13. The device of claim 8, wherein the dielectric medium is a first dielectric medium, and further comprising a third conductor electrode separated from the second conductor electrode by a second dielectric medium.

14. The device of claim 8, wherein the metal-insulator-metal capacitor operates with at least one of: substantially stable capacitance with frequencies ranging from about one gigahertz to about twenty gigahertz, or a quality factor of greater than five hundred during operation at a frequency of about one gigahertz.

15. A capacitor, comprising:
   a first conductor overlapping with a dielectric layer;
   the dielectric layer overlapping with a second conductor, the first conductor electrically coupled to the second conductor via an array of interconnects through the dielectric layer; and
   the second conductor coupled to a substrate, wherein distribution of the array of interconnects facilitates an increase in high-frequency performance of the capacitor by reducing a surface current density of the capacitor.

16. The capacitor of claim 15, wherein the first conductor extends over at least a portion of a radio frequency ground plane associated with the capacitor.

17. The capacitor of claim 15, wherein the array of interconnects comprises a geometrically distributed array.

18. The capacitor of claim 15, wherein the array of interconnects is positioned proximate to a periphery of the first conductor.

19. The capacitor of claim 15, wherein the capacitor is useable as a tuning element as part of an impedance matching network.

20. The capacitor of claim 15, wherein the capacitor is a part of a millimeter wave frequency phase shifter for antenna elements.

\* \* \* \* \*